United States Patent
Park

(10) Patent No.: US 8,125,146 B2
(45) Date of Patent: Feb. 28, 2012

(54) ORGANIC LIGHT EMITTING DISPLAY HAVING A SECOND FRIT PORTION CONFIGURED TO MELT MORE EASILY THAN A FRIT PORTION

(75) Inventor: Jin Woo Park, Yongin-si (KR)

(73) Assignee: Samsung Mobile Display Co., Ltd., Suwon-si (KR)

( * ) Notice: Subject to any disclaimer, the term of this patent is extended or adjusted under 35 U.S.C. 154(b) by 0 days.

(21) Appl. No.: 11/541,009

(22) Filed: Sep. 29, 2006

(65) Prior Publication Data
US 2007/0176549 A1 Aug. 2, 2007

(30) Foreign Application Priority Data

Jan. 27, 2006 (KR) .................. 10-2006-0008761

(51) Int. Cl.
*H01J 1/62* (2006.01)
*H01J 63/04* (2006.01)

(52) U.S. Cl. ....................................... 313/512
(58) Field of Classification Search ............ None
See application file for complete search history.

(56) References Cited

U.S. PATENT DOCUMENTS

| | | | |
|---|---|---|---|
| 3,966,449 A | 6/1976 | Foster et al. | |
| 4,238,704 A | 12/1980 | Bonk et al. | |
| 5,874,804 A | 2/1999 | Rogers | |
| 6,210,815 B1 * | 4/2001 | Ooishi | 428/690 |
| 6,424,009 B1 | 7/2002 | Ju | |
| 6,489,719 B1 * | 12/2002 | Young et al. | 313/512 |
| 6,551,724 B2 * | 4/2003 | Ishii et al. | 428/690 |
| 6,554,672 B2 | 4/2003 | Dunham et al. | |
| 6,555,025 B1 | 4/2003 | Krupetsky et al. | |
| 6,646,284 B2 | 11/2003 | Yamazaki et al. | |
| 6,660,547 B2 | 12/2003 | Guenther | |
| 6,831,725 B2 | 12/2004 | Niiya | |
| 6,896,572 B2 | 5/2005 | Park et al. | |
| 6,914,661 B2 | 7/2005 | Masuda et al. | |
| 6,936,963 B2 | 8/2005 | Langer et al. | |
| 6,956,324 B2 | 10/2005 | Yamazaki | |
| 6,956,638 B2 | 10/2005 | Akiyama et al. | |
| 6,993,537 B2 * | 1/2006 | Buxton et al. | 707/104.1 |

(Continued)

FOREIGN PATENT DOCUMENTS
CN 1551686 A 12/2004
(Continued)

OTHER PUBLICATIONS

Hurbert et al. (WO 2005/050751 A2) published Jun. 2, 2005.*
(Continued)

*Primary Examiner* — Toan Ton
*Assistant Examiner* — Britt D Hanley
(74) *Attorney, Agent, or Firm* — Knobbe Martens Olson & Bear LLP

(57) ABSTRACT

An organic light emitting display includes a first substrate including a pixel region in which organic light emitting diodes are formed and a non-pixel region formed on the outer circumference of the pixel region. A second substrate is attached to the first substrate, and a sealing is provided between the first substrate and the second substrate. The sealing includes a first frit layer and a second frit layer which melts substantially more easily than the first frit layer upon irradiation of a laser or infrared beam thereto.

21 Claims, 8 Drawing Sheets

U.S. PATENT DOCUMENTS

| | | |
|---|---|---|
| 6,998,776 B2 | 2/2006 | Aitken et al. |
| 7,141,925 B2 | 11/2006 | Wittmann et al. |
| 7,154,218 B2 | 12/2006 | Murakami et al. |
| 7,186,020 B2 | 3/2007 | Taya et al. |
| 7,187,121 B2 | 3/2007 | Hasegawa et al. |
| 7,193,364 B2 * | 3/2007 | Klausmann et al. .......... 313/512 |
| 7,193,366 B2 | 3/2007 | Tomimatsu et al. |
| 7,211,938 B2 | 5/2007 | Tanaka |
| 7,247,986 B2 | 7/2007 | Kang et al. |
| 7,291,977 B2 * | 11/2007 | Kim et al. ................... 313/512 |
| 7,317,281 B2 * | 1/2008 | Hayashi et al. ............... 313/512 |
| 7,359,021 B2 | 4/2008 | Ota et al. |
| 7,371,143 B2 | 5/2008 | Becken et al. |
| 7,407,423 B2 | 8/2008 | Aitken et al. |
| 7,425,166 B2 | 9/2008 | Burt et al. |
| 7,425,518 B2 | 9/2008 | Yoshida et al. |
| 7,452,738 B2 | 11/2008 | Hayashi et al. |
| 7,474,375 B2 | 1/2009 | Kwak et al. |
| 7,528,544 B2 | 5/2009 | Kwak et al. |
| 7,537,504 B2 | 5/2009 | Becken et al. |
| 7,579,203 B2 | 8/2009 | Yamazaki et al. |
| 7,579,220 B2 | 8/2009 | Ohnuma et al. |
| 7,585,022 B2 | 9/2009 | Achilles et al. |
| 7,586,254 B2 | 9/2009 | Kwak et al. |
| 7,597,603 B2 | 10/2009 | Becken et al. |
| 2003/0066311 A1 * | 4/2003 | Li et al. ............... 65/43 |
| 2003/0122476 A1 * | 7/2003 | Wang et al. ................. 313/493 |
| 2003/0137630 A1 * | 7/2003 | Niiya .................... 349/153 |
| 2004/0023591 A1 | 2/2004 | Matsuoka |
| 2004/0069017 A1 * | 4/2004 | Li et al. ............... 65/43 |
| 2004/0075380 A1 * | 4/2004 | Takemoto et al. .......... 313/500 |
| 2004/0104655 A1 | 6/2004 | Kodera et al. |
| 2005/0001545 A1 * | 1/2005 | Aitken et al. ............... 313/512 |
| 2005/0140290 A1 | 6/2005 | Park et al. |
| 2005/0233885 A1 * | 10/2005 | Yoshida et al. ............... 501/15 |
| 2005/0269940 A1 | 12/2005 | Nishikawa |
| 2006/0049396 A1 | 3/2006 | Pichler et al. |
| 2006/0082298 A1 | 4/2006 | Becken et al. |
| 2006/0278965 A1 | 12/2006 | Foust et al. |
| 2006/0290261 A1 | 12/2006 | Sawai et al. |
| 2007/0170324 A1 | 7/2007 | Lee et al. |
| 2007/0170423 A1 | 7/2007 | Choi et al. |
| 2007/0170605 A1 | 7/2007 | Lee et al. |
| 2007/0170839 A1 | 7/2007 | Choi et al. |
| 2007/0170845 A1 | 7/2007 | Choi et al. |
| 2007/0170850 A1 | 7/2007 | Choi et al. |
| 2007/0170855 A1 | 7/2007 | Choi et al. |
| 2007/0170857 A1 | 7/2007 | Choi et al. |
| 2007/0170859 A1 | 7/2007 | Choi et al. |
| 2007/0170860 A1 | 7/2007 | Choi et al. |
| 2007/0170861 A1 | 7/2007 | Lee et al. |
| 2007/0171637 A1 | 7/2007 | Choi |
| 2007/0173167 A1 | 7/2007 | Choi et al. |
| 2007/0177069 A1 | 8/2007 | Lee |
| 2007/0197120 A1 | 8/2007 | Lee |
| 2007/0232182 A1 | 10/2007 | Park |
| 2008/0074036 A1 | 3/2008 | Wang et al. |

FOREIGN PATENT DOCUMENTS

| | | |
|---|---|---|
| CN | 1669363 A | 9/2005 |
| DE | 10 2004 0031670 | 8/2005 |
| JP | 030-37933 | 2/1991 |
| JP | 04-138688 A | 5/1992 |
| JP | 04301879 * | 10/1992 |
| JP | 07-74583 | 3/1995 |
| JP | 09-278483 | 10/1997 |
| JP | 10-074583 | 3/1998 |
| JP | 10-74583 | 3/1998 |
| JP | 10-201585 | 8/1998 |
| JP | 2001-55527 | 2/2001 |
| JP | 2001-203076 | 2/2001 |
| JP | 2001-319775 | 11/2001 |
| JP | 2002 020169 | 1/2002 |
| JP | 2002-93576 | 3/2002 |
| JP | 2002-100472 | 4/2002 |
| JP | 2002 117777 | 4/2002 |
| JP | 2002 170664 | 6/2002 |
| JP | 2002-216951 | 8/2002 |
| JP | 2002-280169 | 9/2002 |
| JP | 2002-359070 | 12/2002 |
| JP | 2003-123966 | 4/2003 |
| JP | 2003-228302 | 8/2003 |
| JP | 2003 243160 | 8/2003 |
| JP | 2003 297552 | 10/2003 |
| JP | 2003-332061 | 11/2003 |
| JP | 2004 29552 | 1/2004 |
| JP | 2004 070351 | 3/2004 |
| JP | 2004 303733 | 10/2004 |
| JP | 2004 319103 | 11/2004 |
| JP | 2005-71984 | 3/2005 |
| JP | 2005-112676 | 4/2005 |
| JP | 2005-123089 | 5/2005 |
| JP | 2005 158672 | 6/2005 |
| JP | 2005 190683 | 7/2005 |
| JP | 2005 251415 | 9/2005 |
| JP | 2005 258405 | 9/2005 |
| JP | 2005 340020 | 12/2005 |
| JP | 2006 524419 | 10/2006 |
| TW | 569166 | 1/2004 |
| TW | I227094 | 1/2005 |
| TW | I228686 | 3/2005 |
| TW | I237218 | 8/2005 |
| TW | 200541379 | 12/2005 |
| TW | 200541382 | 12/2005 |
| TW | 200616223 A | 5/2006 |
| TW | I256857 B | 6/2006 |
| TW | I258321 B | 7/2006 |
| WO | WO 03/005774 | 1/2003 |
| WO | WO 2004-095597 | 4/2004 |

OTHER PUBLICATIONS

Japan Office Action dated Jul. 28, 2009 of the Japanese Patent Application No. 2006-153567.

Japan Office Action dated Jul. 28, 2009 of the Japanese Patent Application No. 2006 178508.

Japan Office Action dated Jul. 14, 2009 of the Japanese Patent Application No. 2006-151960.

Japan Office Action dated Jul. 14, 2009 of the Japanese Patent Application No. 2006-165210.

Japanese Office Action issued Sep. 8, 2009 in Japanese Patent Application 2007-011996.

Chinese Office Action issued on Jan. 8, 2010 in Patent Application No. 200710003941.0.

Taiwanese Office Action issued Jan. 18, 2010 in Patent Application No. 95145107.

U.S. Office Action dated Mar. 29, 2010 in U.S. Appl. No. 11/541,055.

U.S. Office Action (Advisory Action) dated May 19, 2010 in U.S. Appl. No. 11/529,914.

European Extended Search Report dated Aug. 2, 2011 of the European Patent Application No. 07250355.0 which claims priority of the corresponding Korean priority Application No. 10-2006-0008761.

Notice of Allowance dated Nov. 30, 2011 of corresponding Taiwanese Patent Application No. 096102645-4 pages.

* cited by examiner

RADIATION OF LASER

RADIATION OF UV

RADIATION OF LASER

ORGANIC LIGHT EMITTING DISPLAY HAVING A SECOND FRIT PORTION CONFIGURED TO MELT MORE EASILY THAN A FRIT PORTION

CROSS-REFERENCE TO RELATED APPLICATIONS

This application claims the benefit of Korean Patent Application No. 10-2006-0008761, filed on Jan. 27, 2006, in the Korean Intellectual Property Office, the disclosure of which is incorporated herein by reference in its entirety. This application is related to and incorporates herein by reference the entire contents of the following concurrently filed applications:

| Title | Filing Date | Application No. |
|---|---|---|
| ORGANIC LIGHT-EMITTING DISPLAY DEVICE AND METHOD OF FABRICATING THE SAME | Sep. 29, 2006 | 11/541,055 |
| ORGANIC LIGHT-EMITTING DISPLAY DEVICE AND METHOD OF MANUFACTURING THE SAME | Sep. 29, 2006 | 11/529,914 |
| ORGANIC LIGHT EMITTING DISPLAY DEVICE | Sep. 29, 2006 | 11/541,139 |
| ORGANIC LIGHT-EMITTING DISPLAY DEVICE WITH FRIT SEAL AND REINFORCING STRUCTURE | Sep. 29, 2006 | 11/541,047 |
| ORGANIC LIGHT EMITTING DISPLAY DEVICE METHOD OF FABRICATING THE SAME | Sep. 29, 2006 | 11/540,150 |
| ORGANIC LIGHT-EMITTING DISPLAY DEVICE WITH FRIT SEAL AND REINFORCING STRUCTURE BONDED TO FRAME | Sep. 29, 2006 | 11/540,151 |
| METHOD FOR PACKAGING ORGANIC LIGHT EMITTING DISPLAY WITH FRIT SEAL AND REINFORCING STURUTURE | Sep. 29, 2006 | 11/529,910 |
| METHOD FOR PACKAGING ORGANIC LIGHT EMITTING DISPLAY WITH FRIT SEAL AND REINFORCING STURUTURE | Sep. 29, 2006 | 11/540,084 |
| ORGANIC LIGHT-EMITTING DISPLAY DEVICE AND THE PREPARATION METHOD OF THE SAME | Sep. 29, 2006 | 11/540,008 |
| ORGANIC LIGHT EMITTING DISPLAY AND FABRICATING METHOD OF THE SAME | Sep. 29, 2006 | 11/541,048 |
| ORGANIC LIGHT-EMITTING DISPLAY AND METHOD OF MAKING THE SAME | Sep. 29, 2006 | 11/540,021 |
| ORGANIC LIGHT EMITTING DISPLAY AND FABRICATING METHOD OF THE SAME | Sep. 29, 2006 | 11/540,024 |
| ORGANIC LIGHT EMITTING DISPLAY DEVICE AND MANUFACTURING METHOD THEREOF | Sep. 29, 2006 | 11/529,995 |
| ORGANIC LIGHT-EMITTING DISPLAY DEVICE AND MANUFACTURING METHOD OF THE SAME | Sep. 29, 2006 | 11/540,157 |
| ORGANIC LIGHT EMITTING DISPLAY AND FABRICATING METHOD OF THE SAME | Sep. 29, 2006 | 11/540,149 |
| ORGANIC LIGHT EMITTING DISPLAY AND METHOD OF FABRICATING THE SAME | Sep. 29, 2006 | 11/529,916 |
| ORGANIC LIGHT EMITTING DISPLAY DEVICE METHOD OF FABRICATING THE SAME | Sep. 29, 2006 | 11/529,891 |
| ORGANIC LIGHT EMITTING DISPLAY AND METHOD OF FABRICATING THE SAME | Sep. 29, 2006 | 11/540,103 |

BACKGROUND

1. Field of the Invention

The present invention relates to organic light emitting display devices and, more particularly, to packaging such devices.

2. Discussion of Related Art

Recently, organic light emitting displays that use organic light emitting diodes are spotlighted. The organic light emitting displays are spontaneous emission displays that electrically excite phosphorous organic compounds to emit light and can be driven at a low voltage, can be easily made thin, and have a wide view angle and high response speed. The organic light emitting display includes a plurality of pixels that include organic light emitting diodes that are formed on a substrate and thin film transistors (TFT) for driving the organic light emitting diodes. Since the organic light emitting diodes are sensitive to moisture, a sealing structure in which moisture is prevented from contacting the organic materials by using a metal cap coated with an absorbent or a sealing glass substrate is provided. U.S. Pat. No. 6,998,776 B2 discloses that an organic light-emitting display includes a first substrate plate, a second substrate plate and a frit connecting the plates.

SUMMARY OF CERTAIN INVENTIVE ASPECTS

An aspect of the invention provides an organic light emitting display device, which may comprise: a first substrate made of a single layer or multiple layers; a second substrate made of a single layer or multiple layers and opposing the first substrate; an array of organic light emitting pixels interposed between the first and second substrates; and a fit seal comprises a plurality of elongated segments forming a closed loop surrounding the array and interposed between the first and second substrates, wherein the frit seal, the first substrate and the second substrate together define an enclosed space in which the array is located, wherein the frit seal comprises a first frit portion contacting the first substrate and a second frit portion contacting the second substrate, wherein a first one of the plurality of segments comprises the first and second frit portions, wherein the second fit portion is configured to melt substantially easier than the first fit portion upon irradiation of a laser or infrared beam thereto.

In the foregoing device, the first and second frit portions may contact each other. Each of the first and second frit portions may comprise a light-to-heat conversion material configured to generate heat upon receiving the laser or infrared beam, and wherein the second frit portion may comprise an amount of the light-to-heat conversion material substantially more than the first frit portion. The second frit portion may comprise a light-to-heat conversion material configured to generate heat upon receiving the laser or infrared beam, and wherein the first frit portion may be substantially free of the light-to-heat conversion material. The first frit portion may be substantially transparent. The second frit portion may be substantially non-transparent. One of the first and second frit portions may comprise at least one selected from the group consisting of $SiO_2$, $PbO$, $V_2O_5$, $ZnO$, $B_2O_3$, and $P_2O_5$. The first frit portion may comprise a first end facing the second substrate, the second frit portion may comprise a second end facing the first substrate, wherein the first end may have a first width perpendicular to the shortest imaginary line interconnecting the first and second substrates in a plane perpendicular to an elongation of the first segment, and wherein the second end may have a second width in the same direction, wherein the first width may be greater than the second width.

The second end may contact a peripheral portion of the first end along the direction. The second end may contact a central portion of the first end along the direction.

Still in the foregoing device, the first frit portion may comprise a first end facing the second substrate, the second frit portion may comprise a second end facing the first substrate, wherein the first portion may have a first height from the first substrate to the first end in a direction parallel to the shortest imaginary line interconnecting the first and second substrates in a plane perpendicular to an elongation of the first segment, wherein the second portion may have a second height from the second substrate to the second end in the same direction, wherein the first height may be greater than the second height. The array may be formed on the second substrate, and wherein the array and the first substrate may form a gap therebetween. The device may be configured to display image through the first substrate. The first frit portion may have a volume substantially greater than that of the second frit portion. The first frit portion may be bonded to the first substrate by baking the first substrate and the first frit portion in contact with the first substrate. The second frit portion may be bonded to the second substrate and the first frit portion by applying a laser or infrared light thereto.

Further in the foregoing device, the device may further comprise at least one supplementary structure extending along the first segment, wherein the at least one supplementary structure is interposed between and interconnects the first and second substrates, wherein the supplementary structure is located inside or outside the enclosed space. The supplementary structure may be configured to improve sealing of the enclosed space. The device may further comprise a first supplementary structure and a second supplementary structure, each of which is interposed between and interconnects the first and second substrates, wherein the first supplementary structure extends along the first segment inside the enclosed space, and wherein the second supplementary structure extends along the first segment outside the enclosed space. The device may further comprise a supplementary structure extending along the first segment and located inside or outside the enclosed space, wherein the supplementary structure comprises a portion interposed between and interconnects the first frit portion and the second substrate. The supplementary structure may comprise another portion that is not interposed between the first frit portion of the frit seal and the first substrates. The device may comprise a first supplementary structure and a second supplementary structure, each of which extends along the first segment inside or outside the enclosed space, wherein the first supplementary structure is interposed between and interconnects the first and second substrates, wherein the second supplementary structure is interposed between and interconnects the first frit portion and the second substrate. The frit seal may comprise one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

Another aspect of the present invention provides an organic light emitting display, which may comprises a first substrate including a pixel region in which at least one organic light emitting diode including a first electrode, an organic layer, and a second electrode is formed and a non-pixel region formed on the outer circumference of the pixel region, a second substrate attached to one region including the pixel region of the first substrate, and a first sealing material provided between the non-pixel region of the first substrate and the second substrate. The first sealing material may comprise at least one transparent first frit layer and an opaque second frit layer.

Still another aspect of the present invention provides a method of fabricating an organic light emitting display comprising a first substrate comprising a pixel region in which at least one organic light emitting diode is formed and a non-pixel region formed on the outer circumference of the pixel region and a second substrate attached to one region including the pixel region of the first substrate, which may comprise the steps of forming a transparent first frit layer on a second substrate, sintering the first frit layer at a first temperature, forming an opaque second frit layer on one region of the first frit layer, sintering the second frit layer at a second temperature, attaching a first substrate onto the second substrate so that the pixel region is at least sealed up, and melting the first frit layer and the second frit layer provided between the second substrate and the first substrate to attach the first substrate and the second substrate to each other.

BRIEF DESCRIPTION OF THE DRAWINGS

These and other features and advantages of the invention will become apparent and more readily appreciated from the following description of embodiments, taken in conjunction with the accompanying drawings of which.

DETAILED DESCRIPTION OF EMBODIMENTS

Hereinafter, embodiments of the present invention will be described in detail with reference to the accompanying drawings as follows.

An organic light emitting display (OLED) is a display device comprising an array of organic light emitting diodes. Organic light emitting diodes are solid state devices which include an organic material and are adapted to generate and emit light when appropriate electrical potentials are applied.

Figure 6A:
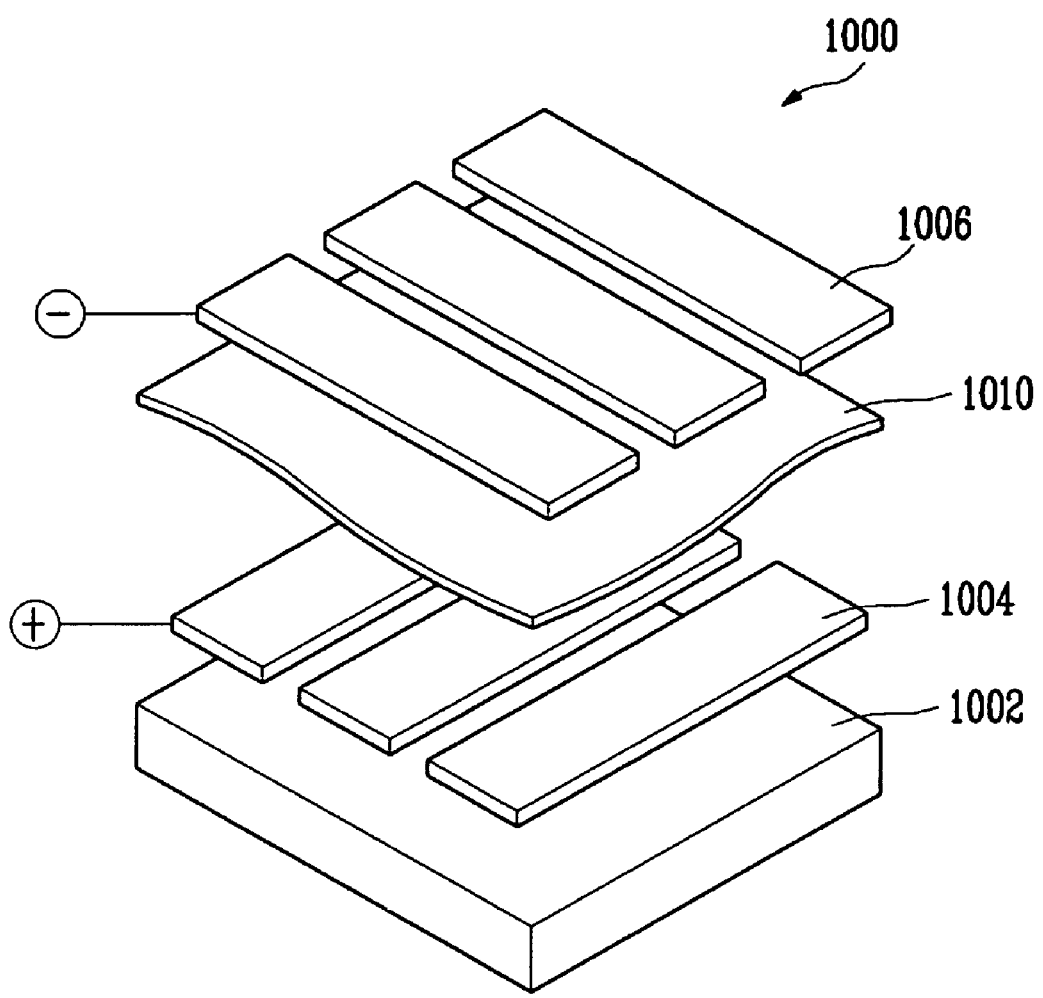
FIG. 6A is a schematic exploded view of a passive matrix type organic light emitting display device in accordance with one embodiment.
Figure 6B:
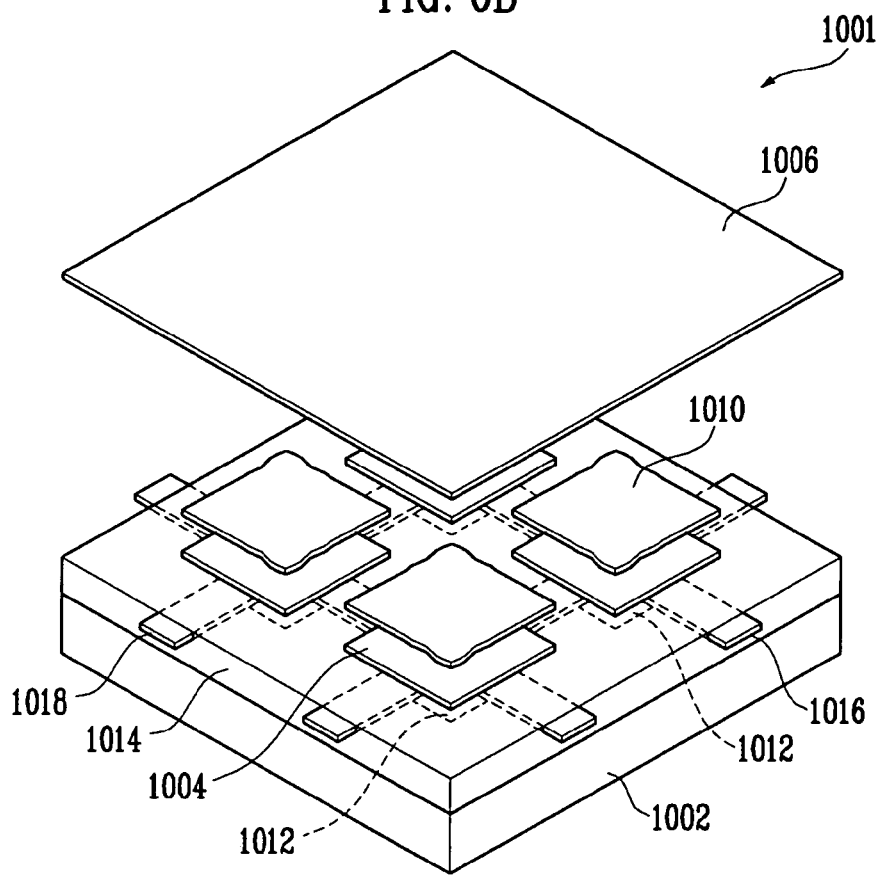
FIG. 6B is a schematic exploded view of an active matrix type organic light emitting display device in accordance with one embodiment.

OLEDs can be generally grouped into two basic types dependent on the arrangement with which the stimulating electrical current is provided. FIG. 6A schematically illustrates an exploded view of a simplified structure of a passive matrix type OLED 1000. FIG. 6B schematically illustrates a simplified structure of an active matrix type OLED 1001. In both configurations, the OLED 1000, 1001 includes OLED pixels built over a substrate 1002, and the OLED pixels include an anode 1004, a cathode 1006 and an organic layer 1010. When an appropriate electrical current is applied to the anode 1004, electric current flows through the pixels and visible light is emitted from the organic layer.

Referring to FIG. 6A, the passive matrix OLED (PMOLED) design includes elongate strips of anode 1004 arranged generally perpendicular to elongate strips of cathode 1006 with organic layers interposed therebetween. The intersections of the strips of cathode 1006 and anode 1004 define individual OLED pixels where light is generated and emitted upon appropriate excitation of the corresponding strips of anode 1004 and cathode 1006. PMOLEDs provide the advantage of relatively simple fabrication.

Referring to FIG. 6B, the active matrix OLED (AMOLED) includes local driving circuits 1012 arranged between the substrate 1002 and an array of OLED pixels. An individual pixel of AMOLEDs is defined between the common cathode 1006 and an anode 1004, which is electrically isolated from other anodes. Each local driving circuit 1012 is coupled with an anode 1004 of the OLED pixels and further coupled with a data line 1016 and a scan line 1018. In embodiments, the scan lines 1018 supply scan signals that select rows of the driving circuits, and the data lines 1016 supply data signals for particular driving circuits. The data signals and scan signals stimulate the local driving circuits 1012, which excite the anodes 1004 so as to emit light from their corresponding pixels.

In the illustrated AMOLED, the local driving circuits 1012, the data lines 1016 and scan lines 1018 are buried in a planarization layer 1014, which is interposed between the pixel array and the substrate 1002. The planarization layer 1014 provides a planar top surface on which the organic light emitting pixel array is formed. The planarization layer 1014 may be formed of organic or inorganic materials, and formed of two or more layers although shown as a single layer. The local driving circuits 1012 are typically formed with thin film transistors (TFT) and arranged in a grid or array under the OLED pixel array. The local driving circuits 1012 may be at least partly made of organic materials, including organic TFT. AMOLEDs have the advantage of fast response time improving their desirability for use in displaying data signals. Also, AMOLEDs have the advantages of consuming less power than passive matrix OLEDs.

Referring to common features of the PMOLED and AMOLED designs, the substrate 1002 provides structural support for the OLED pixels and circuits. In various embodiments, the substrate 1002 can comprise rigid or flexible materials as well as opaque or transparent materials, such as plastic, glass, and/or foil. As noted above, each OLED pixel or diode is formed with the anode 1004, cathode 1006 and organic layer 1010 interposed therebetween. When an appropriate electrical current is applied to the anode 1004, the cathode 1006 injects electrons and the anode 1004 injects holes. In certain embodiments, the anode 1004 and cathode 1006 are inverted; i.e., the cathode is formed on the substrate 1002 and the anode is opposingly arranged.

Interposed between the cathode 1006 and anode 1004 are one or more organic layers. More specifically, at least one emissive or light emitting layer is interposed between the cathode 1006 and anode 1004. The light emitting layer may comprise one or more light emitting organic compounds. Typically, the light emitting layer is configured to emit visible light in a single color such as blue, green, red or white. In the illustrated embodiment, one organic layer 1010 is formed between the cathode 1006 and anode 1004 and acts as a light emitting layer. Additional layers, which can be formed between the anode 1004 and cathode 1006, can include a hole transporting layer, a hole injection layer, an electron transporting layer and an electron injection layer.

Hole transporting and/or injection layers can be interposed between the light emitting layer 1010 and the anode 1004. Electron transporting and/or injecting layers can be interposed between the cathode 1006 and the light emitting layer 1010. The electron injection layer facilitates injection of electrons from the cathode 1006 toward the light emitting layer 1010 by reducing the work function for injecting electrons from the cathode 1006. Similarly, the hole injection layer facilitates injection of holes from the anode 1004 toward the light emitting layer 1010. The hole and electron transporting layers facilitate movement of the carriers injected from the respective electrodes toward the light emitting layer.

In some embodiments, a single layer may serve both electron injection and transportation functions or both hole injection and transportation functions. In some embodiments, one or more of these layers are lacking. In some embodiments, one or more organic layers are doped with one or more materials that help injection and/or transportation of the carriers. In embodiments where only one organic layer is formed between the cathode and anode, the organic layer may include not only an organic light emitting compound but also certain functional materials that help injection or transportation of carriers within that layer.

There are numerous organic materials that have been developed for use in these layers including the light emitting layer. Also, numerous other organic materials for use in these layers are being developed. In some embodiments, these organic materials may be macromolecules including oligomers and polymers. In some embodiments, the organic materials for these layers may be relatively small molecules. The skilled artisan will be able to select appropriate materials for each of these layers in view of the desired functions of the individual layers and the materials for the neighboring layers in particular designs.

In operation, an electrical circuit provides appropriate potential between the cathode 1006 and anode 1004. This results in an electrical current flowing from the anode 1004 to the cathode 1006 via the interposed organic layer(s). In one embodiment, the cathode 1006 provides electrons to the adjacent organic layer 1010. The anode 1004 injects holes to the organic layer 1010. The holes and electrons recombine in the organic layer 1010 and generate energy particles called "excitons." The excitons transfer their energy to the organic light emitting material in the organic layer 1010, and the energy is used to emit visible light from the organic light emitting material. The spectral characteristics of light generated and emitted by the OLED 1000, 1001 depend on the nature and composition of organic molecules in the organic layer(s). The composition of the one or more organic layers can be selected to suit the needs of a particular application by one of ordinary skill in the art.

OLED devices can also be categorized based on the direction of the light emission. In one type referred to as "top emission" type, OLED devices emit light and display images through the cathode or top electrode 1006. In these embodiments, the cathode 1006 is made of a material transparent or at least partially transparent with respect to visible light. In certain embodiments, to avoid losing any light that can pass through the anode or bottom electrode 1004, the anode may be made of a material substantially reflective of the visible light. A second type of OLED devices emits light through the anode or bottom electrode 1004 and is called "bottom emission" type. In the bottom emission type OLED devices, the anode 1004 is made of a material which is at least partially transparent with respect to visible light. Often, in bottom emission type OLED devices, the cathode 1006 is made of a material substantially reflective of the visible light. A third type of OLED devices emits light in two directions, e.g. through both anode 1004 and cathode 1006. Depending upon the direction(s) of the light emission, the substrate may be formed of a material which is transparent, opaque or reflective of visible light.

Figure 6C:
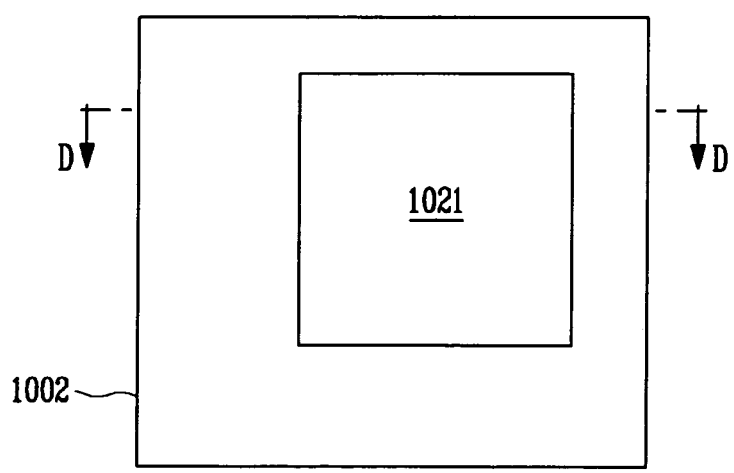
FIG. 6C is a schematic top plan view of an organic light emitting display in accordance with one embodiment.

In many embodiments, an OLED pixel array 1021 comprising a plurality of organic light emitting pixels is arranged over a substrate 1002 as shown in FIG. 6C. In embodiments, the pixels in the array 1021 are controlled to be turned on and off by a driving circuit (not shown), and the plurality of the pixels as a whole displays information or image on the array 1021. In certain embodiments, the OLED pixel array 1021 is arranged with respect to other components, such as drive and control electronics to define a display region and a non-display region. In these embodiments, the display region refers to the area of the substrate 1002 where OLED pixel array 1021 is formed. The non-display region refers to the remaining areas of the substrate 1002. In embodiments, the non-display region can contain logic and/or power supply circuitry. It will be understood that there will be at least portions of control/drive circuit elements arranged within the display region. For example, in PMOLEDs, conductive components will extend into the display region to provide appropriate potential to the anode and cathodes. In AMOLEDs, local driving circuits and data/scan lines coupled with the driving circuits will extend into the display region to drive and control the individual pixels of the AMOLEDs.

Figure 6D:
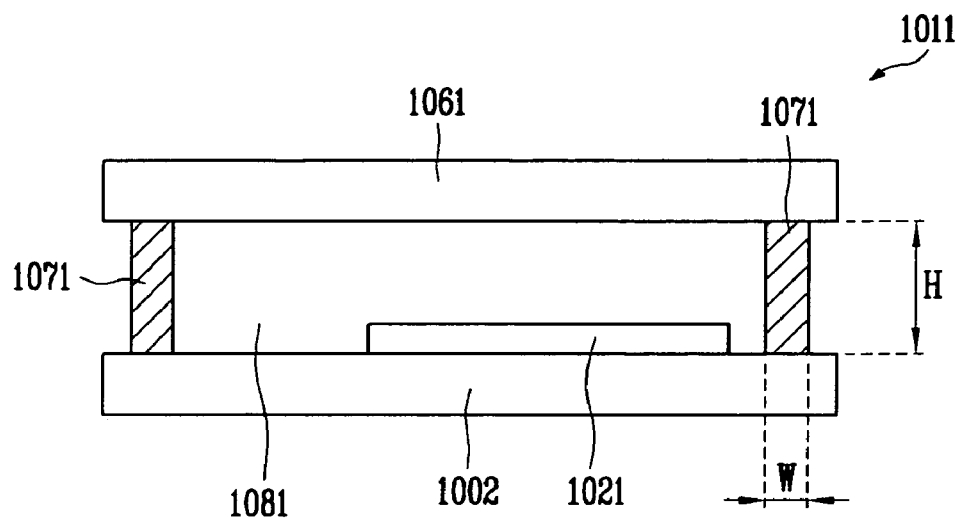
FIG. 6D is a cross-sectional view of the organic light emitting display of FIG. 6C, taken along the line d-d.

One design and fabrication consideration in OLED devices is that certain organic material layers of OLED devices can suffer damage or accelerated deterioration from exposure to water, oxygen or other harmful gases. Accordingly, it is generally understood that OLED devices be sealed or encapsulated to inhibit exposure to moisture and oxygen or other harmful gases found in a manufacturing or operational environment. FIG. 6D schematically illustrates a cross-section of an encapsulated OLED device 1011 having a layout of FIG. 6C and taken along the line d-d of FIG. 6C. In this embodiment, a generally planar top plate or substrate 1061 engages with a seal 1071 which further engages with a bottom plate or substrate 1002 to enclose or encapsulate the OLED pixel array 1021. In other embodiments, one or more layers are formed on the top plate 1061 or bottom plate 1002, and the seal 1071 is coupled with the bottom or top substrate 1002, 1061 via such a layer. In the illustrated embodiment, the seal 1071 extends along the periphery of the OLED pixel array 1021 or the bottom or top plate 1002, 1061.

In embodiments, the seal 1071 is made of a frit material as will be further discussed below. In various embodiments, the top and bottom plates 1061, 1002 comprise materials such as plastics, glass and/or metal foils which can provide a barrier to passage of oxygen and/or water to thereby protect the OLED pixel array 1021 from exposure to these substances. In embodiments, at least one of the top plate 1061 and the bottom plate 1002 are formed of a substantially transparent material.

To lengthen the life time of OLED devices 1011, it is generally desired that seal 1071 and the top and bottom plates 1061, 1002 provide a substantially non-permeable seal to oxygen and water vapor and provide a substantially hermetically enclosed space 1081. In certain applications, it is indicated that the seal 1071 of a frit material in combination with the top and bottom plates 1061, 1002 provide a barrier to oxygen of less than approximately $10^{-3}$ cc/m$^2$-day and to water of less than $10^{-6}$ g/m$^2$-day. Given that some oxygen and moisture can permeate into the enclosed space 1081, in some embodiments, a material that can take up oxygen and/or moisture is formed within the enclosed space 1081.

The seal 1071 has a width W, which is its thickness in a direction parallel to a surface of the top or bottom substrate 1061, 1002 as shown in FIG. 6D. The width varies among embodiments and ranges from about 300 μm to about 3000 μm, optionally from about 500 μm to about 1500 μm. Also, the width may vary at different positions of the seal 1071. In some embodiments, the width of the seal 1071 may be the largest where the seal 1071 contacts one of the bottom and top substrate 1002, 1061 or a layer formed thereon. The width may be the smallest where the seal 1071 contacts the other. The width variation in a single cross-section of the seal 1071 relates to the cross-sectional shape of the seal 1071 and other design parameters.

The seal 1071 has a height H, which is its thickness in a direction perpendicular to a surface of the top or bottom substrate 1061, 1002 as shown in FIG. 6D. The height varies among embodiments and ranges from about 2 μm to about 30 μm, optionally from about 10 μm to about 15 μm. Generally, the height does not significantly vary at different positions of the seal 1071. However, in certain embodiments, the height of the seal 1071 may vary at different positions thereof.

In the illustrated embodiment, the seal 1071 has a generally rectangular cross-section. In other embodiments, however, the seal 1071 can have other various cross-sectional shapes such as a generally square cross-section, a generally trapezoidal cross-section, a cross-section with one or more rounded edges, or other configuration as indicated by the needs of a given application. To improve hermeticity, it is generally desired to increase the interfacial area where the seal 1071 directly contacts the bottom or top substrate 1002, 1061 or a layer formed thereon. In some embodiments, the shape of the seal can be designed such that the interfacial area can be increased.

The seal 1071 can be arranged immediately adjacent the OLED array 1021, and in other embodiments, the seal 1071 is spaced some distance from the OLED array 1021. In certain embodiment, the seal 1071 comprises generally linear segments that are connected together to surround the OLED array 1021. Such linear segments of the seal 1071 can extend, in certain embodiments, generally parallel to respective boundaries of the OLED array 1021. In other embodiment, one or more of the linear segments of the seal 1071 are arranged in a non-parallel relationship with respective boundaries of the OLED array 1021. In yet other embodiments, at least part of the seal 1071 extends between the top plate 1061 and bottom plate 1002 in a curvilinear manner.

As noted above, in certain embodiments, the seal 1071 is formed using a frit material or simply "frit" or "glass frit," which includes fine glass particles. The frit particles includes one or more of magnesium oxide (MgO), calcium oxide (CaO), barium oxide (BaO), lithium oxide (Li$_2$O), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate, etc. In embodiments, these particles range in size from about 2 μm to about 30 μm, optionally about 5 μm to about 10 μm, although not limited only thereto. The particles can be as large as about the distance between the top and bottom substrates 1061, 1002 or any layers formed on these substrates where the frit seal 1071 contacts.

The frit material used to form the seal 1071 can also include one or more filler or additive materials. The filler or additive materials can be provided to adjust an overall thermal expansion characteristic of the seal 1071 and/or to adjust the absorption characteristics of the seal 1071 for selected frequencies of incident radiant energy. The filler or additive material(s) can also include inversion and/or additive fillers to adjust a coefficient of thermal expansion of the frit. For example, the filler or additive materials can include transition metals, such as chromium (Cr), iron (Fe), manganese (Mn), cobalt (Co), copper (Cu), and/or vanadium. Additional materials for the filler or additives include $ZnSiO_4$, $PbTiO_3$, $ZrO_2$, eucryptite.

In embodiments, a frit material as a dry composition contains glass particles from about 20 to about 90 wt %, and the remaining includes fillers and/or additives. In some embodiments, the frit paste contains about 10-30 wt % organic materials and about 70-90% inorganic materials. In some embodiments, the frit paste contains about 20 wt % organic materials and about 80 wt % inorganic materials. In some embodiments, the organic materials may include about 0-30 wt % binder(s) and about 70-100 wt % solvent(s). In some embodiments, about 10 wt % is binder(s) and about 90 wt % is solvent(s) among the organic materials. In some embodiments, the inorganic materials may include about 0-10 wt % additives, about 20-40 wt % fillers and about 50-80 wt % glass powder. In some embodiments, about 0-5 wt % is additive(s), about 25-30 wt % is filler(s) and about 65-75 wt % is the glass powder among the inorganic materials.

In forming a frit seal, a liquid material is added to the dry frit material to form a frit paste. Any organic or inorganic solvent with or without additives can be used as the liquid material. In embodiments, the solvent includes one or more organic compounds. For example, applicable organic compounds are ethyl cellulose, nitro cellulose, hydroxyl propyl cellulose, butyl carbitol acetate, terpineol, butyl cellusolve, acrylate compounds. Then, the thus formed frit paste can be applied to form a shape of the seal 1071 on the top and/or bottom plate 1061, 1002.

In one exemplary embodiment, a shape of the seal 1071 is initially formed from the frit paste and interposed between the top plate 1061 and the bottom plate 1002. The seal 1071 can in certain embodiments be pre-cured or pre-sintered to one of the top plate and bottom plate 1061, 1002. Following assembly of the top plate 1061 and the bottom plate 1002 with the seal 1071 interposed therebetween, portions of the seal 1071 are selectively heated such that the frit material forming the seal 1071 at least partially melts. The seal 1071 is then allowed to resolidify to form a secure joint between the top plate 1061 and the bottom plate 1002 to thereby inhibit exposure of the enclosed OLED pixel array 1021 to oxygen or water.

In embodiments, the selective heating of the frit seal is carried out by irradiation of light, such as a laser or directed infrared lamp. As previously noted, the frit material forming the seal 1071 can be combined with one or more additives or filler such as species selected for improved absorption of the irradiated light to facilitate heating and melting of the frit material to form the seal 1071.

Figure 6E:
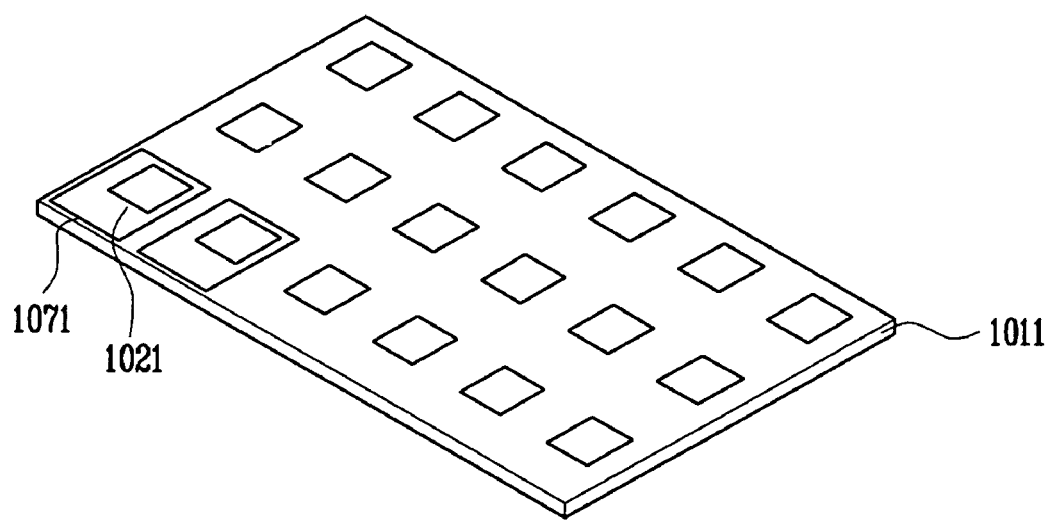
FIG. 6E is a schematic perspective view illustrating mass production of organic light emitting devices in accordance with one embodiment.

In some embodiments, OLED devices 1011 are mass produced. In an embodiment illustrated in FIG. 6E, a plurality of separate OLED arrays 1021 is formed on a common bottom substrate 1101. In the illustrated embodiment, each OLED array 1021 is surrounded by a shaped frit to form the seal 1071. In embodiments, common top substrate (not shown) is placed over the common bottom substrate 1101 and the structures formed thereon such that the OLED arrays 1021 and the shaped frit paste are interposed between the common bottom substrate 1101 and the common top substrate. The OLED arrays 1021 are encapsulated and sealed, such as via the previously described enclosure process for a single OLED display device. The resulting product includes a plurality of OLED devices kept together by the common bottom and top substrates. Then, the resulting product is cut into a plurality of pieces, each of which constitutes an OLED device 1011 of FIG. 6D. In certain embodiments, the individual OLED devices 1011 then further undergo additional packaging operations to further improve the sealing formed by the frit seal 1071 and the top and bottom substrates 1061, 1002.

The organic light emitting display device has a gap between the top surface of the array and the inner surface of the top substrate. Generally, the size of the gap depends on the height of the seal interconnecting two substrates. The frit seal, among other forms of sealing, allows the gap size significantly smaller than others. For example, when using the frit seal, the gap size (the distance between the array and the second substrate) can be in the order of a few μm to several hundred μm. When the gap size is in this range, dark rings called Newton rings may be formed on the display surface due to optical interference created by light incident to the display surface. More specifically, when the gap size is about or less than 10 μm, the possibility of Newton rings may increase. Thus, in packaging an organic light emitting display device with the flit seal, the configuration for avoiding Newton rings can be a design factor.

Figure 1:
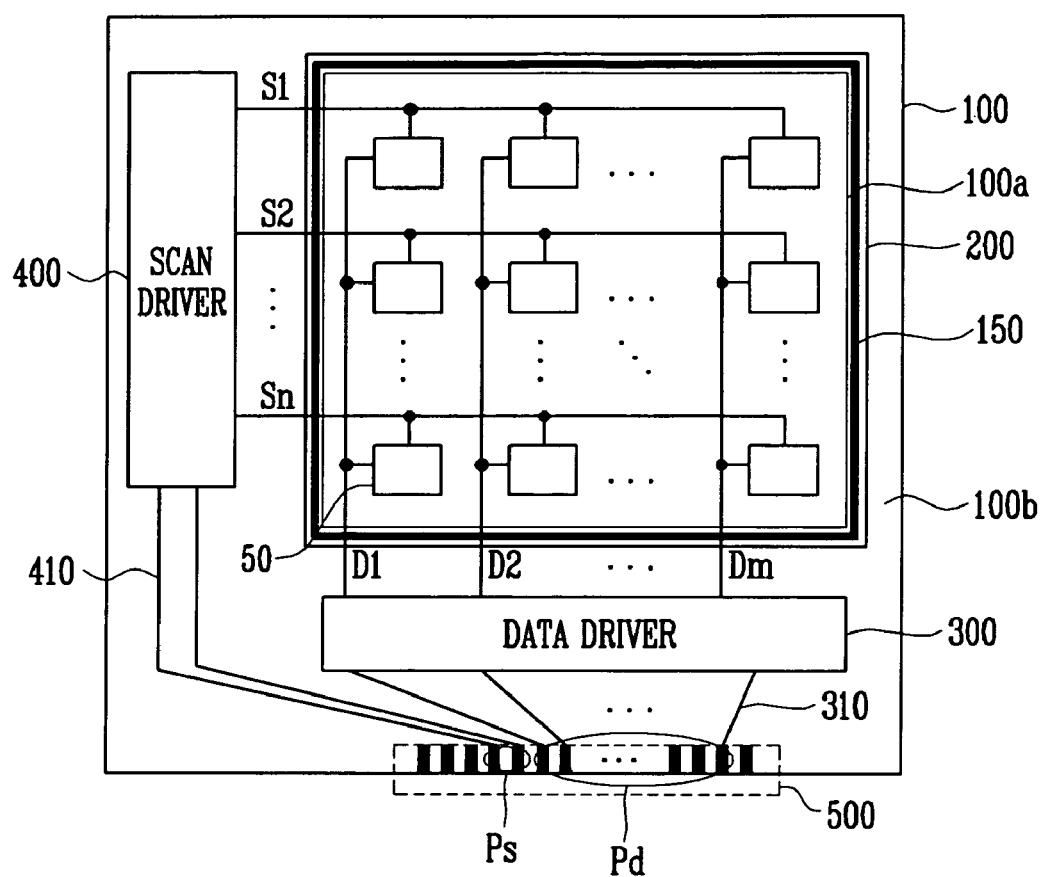
FIG. 1 is a schematic plan view illustrating a second substrate employed in an organic light emitting display according to an embodiment of the present invention.

FIG. 1 is a schematic plan view illustrating a substrate employed in an organic light emitting display according to an embodiment of the present invention. As shown in FIG. 1, the organic light emitting display according to an embodiment of the present invention includes a first or bottom substrate 100, a second or top substrate 200, a first sealing material 150, a data driver 300, a scan driver 400, and a pad unit 500. The first substrate 100 includes a pixel region 100a in which a plurality of organic light emitting diodes or pixels (not shown) having a first electrode (not shown), an organic layer (not shown), and a second electrode (not shown) is formed, and a non-pixel region 100b formed in the outer circumference of the pixel region 100a. The pixel region 100a includes a plurality of scan lines S1, S2, . . . , and Sn arranged in the row direction and a plurality of data lines D1, D2, . . . , and Dm arranged in the column direction, and a plurality of pixels 50 is formed in the regions that are defined by the scan lines S1, S2, . . . , and Sn and the data lines D1, D2, . . . , and Dm. In other words, the pixel region 100a is a region where an image is displayed by a light emitted from an organic light emitting diode, and the non-pixel region 100b represents all of the regions excluding the pixel region 100a on the first substrate 100.

The second substrate 200 is attached to a region of the first substrate 100 that includes the pixel region 100a. At this time, the second substrate 200 is provided to prevent the organic light emitting diodes (not shown) formed on the pixel region 100a on the first substrate 100 from being affected by moisture and oxygen from the outside. Therefore, the organic light emitting diode formed on the first substrate 100 is sealed by the second substrate 200. At this time, although not limited thereto, the second substrate 200 may be formed of a material selected from the group consisting of $SiO_2$, SiNx, and SiOxNy.

The sealing material 150 is provided between the non-pixel region 100b of the first substrate 100 and the second substrate 200. In other words, since a gap between the first substrate 100 and the second substrate 200 is sealed up by the first sealing material 150, the organic light emitting diode provided between the first substrate 100 and the second substrate 200 can be protected from moisture and oxygen. At that time, the first sealing material 150 includes at least one a transparent first frit layer (not shown) and an opaque or non-transparent second frit layer (not shown). The first frit layer and the second frit layer will be described later in detail with reference to FIGS. 5a to 5e.

The data driver 300 is made in the form of a chip, may be mounted on the first substrate 100, and is electrically connected to a second pad Pd of the pad unit 500. The data driver 300 supplies data signals to the plurality of data lines D1, D2, . . . , and Dm. The scan driver 400 is formed on one side of the pixel region 100a on the first substrate 100 and is electrically connected to at least one first pad Ps in the pad unit 500 by at least one scan supply line 410. The scan driver 400 sequentially supplies scan signals to the plurality of scan lines S1, S2, . . . , and Sn that extend in the pixel region 100a. The pad unit 500 supplies driving power to the data driver 300 through a data supply line 310 and to the scan driver 400 through a scan line 410.

In the illustrated embodiment, the sealing material 150 is coated along the outer circumference of the pixel region 100a to seal only the pixel region 100a, although not limited thereto. The first sealing material 150 may be applied to seal the pixel region 100a and the scan driver 400 when the scan driver 400 is built-in. In an embodiment, the size of the second substrate 200 is sufficient to include the pixel region 100a and the scan driver 400.

Figure 2:
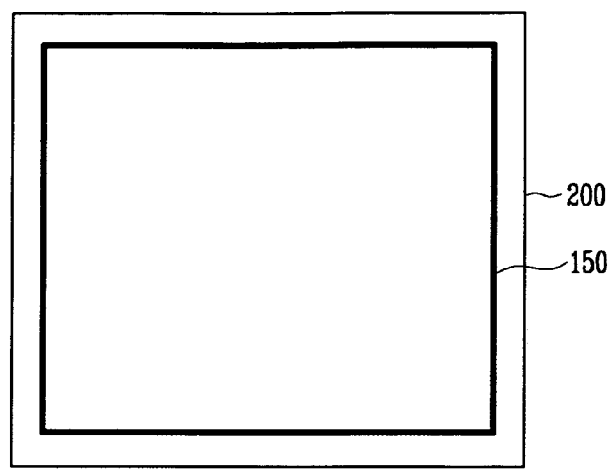
FIG. 2 is a plan view illustrating an example of the second substrate employed in the organic light emitting display according to an embodiment of the present invention.

FIG. 2 is a plan view illustrating an example of the second substrate employed in the organic light emitting display according to an embodiment of the present invention. As shown in FIG. 2, the second substrate 200 according to an embodiment of the present invention includes the first sealing material 150 provided along the edge thereof. The first sealing material 150 includes at least one transparent first frit layer (not shown) and at least one opaque second frit layer (not shown). At that time, the first sealing material 150 is provided to protect the organic light emitting diodes formed on the first substrate (not shown) from moisture or oxygen and to seal up between the first substrate 100 and the second substrate 200.

Figure 3:
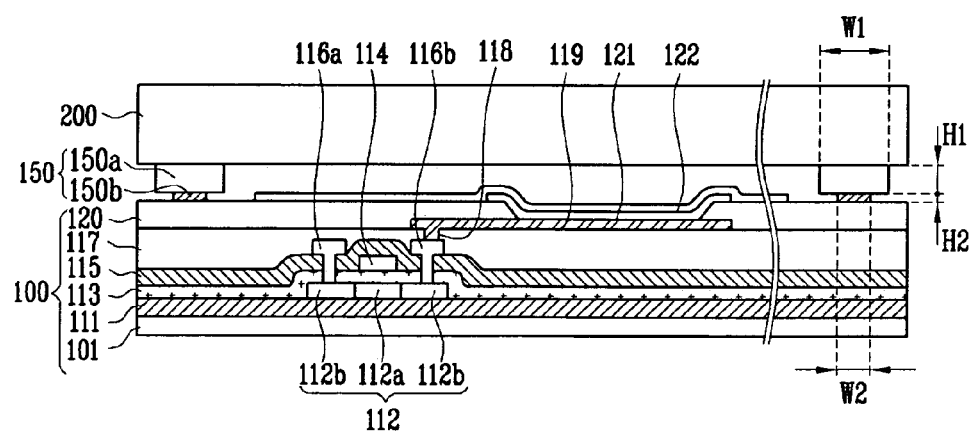
FIG. 3 is a sectional view illustrating the organic light emitting display according to an embodiment of the present invention.

FIG. 3 is a sectional view illustrating the organic light emitting display according to an embodiment of the present invention. As shown in FIG. 3, the organic light emitting display according to an embodiment of the present invention includes the first substrate 100, the first sealing material 150, and the second substrate 200. The first substrate 100 includes a deposition substrate 101 and at least one organic light emitting diode formed on the deposition substrate 101. First, a buffer layer 111 is formed on the deposition substrate 101. The deposition substrate 101 is formed of glass and the buffer layer 111 is formed of an insulating material such as $SiO_2$ and SiNx. On the other hand, the buffer layer 111 is formed to prevent the deposition substrate 101 from being damaged by factors such as heat from the outside.

A semiconductor layer 112 that includes an active layer 112a and source/drain regions 112b is formed on at least one region of the buffer layer 111. A gate insulation layer 113 is formed on the buffer layer 111 to include the semiconductor layer 112. A gate electrode 114 of the size corresponding to the width of an active layer 112a is formed on one region of the gate insulation layer 113. An interlayer insulation layer 115 is formed on the gate insulation layer 113 to include the gate electrode 114. Source and drain electrodes 116a and 116b are formed on a predetermined region of the interlayer insulation layer 115. Each of the source and drain electrodes 116a and 116b is connected to one exposed region of each of the source/drain regions 112b. A planarization layer 117 is formed on the interlayer insulation layer 115 to include the source and drain electrodes 116a and 116b. A first electrode 119 is formed on one region of the planarization layer 117. At this time, the first electrode 119 is connected to one exposed region of one of the source and drain electrodes 116a and 116b by a via hole 118. A pixel definition layer 120 including an aperture (not shown) that exposes at least one region of the first electrode 119 is formed on the planarization layer 117 to include the first electrode 119. An organic layer 121 is formed on the aperture of the pixel definition layer 120 and a second electrode layer 122 is formed on the pixel definition layer 120 to include the organic layer 121.

The second substrate 200 is attached to the first substrate 100 by the first sealing material 150 with predetermined structures interposed in order to protect the predetermined structures formed on the first substrate 100 against the oxygen and moisture from the outside. In an embodiment, the second substrate 200 is made of $SiO_2$.

The first sealing material 150 includes a first frit layer 150a and a second frit layer 150b. The second frit layer 150b melts substantially easier than the first frit layer 150a upon irradiation of a laser or infrared beam thereto. In one embodiment, when all other conditions are the same, the composition of materials forming the second frit layer 150b is to melt quicker than the composition of materials forming the first frit layer 150a. For example, the time required to start the second fit layer 150b to melt is about 10, 20, 30, 40, 50, 55, 60, 65, 70, 75, 80 or 90% of the time required to start the first frit layer 150a to melt. In another embodiment, when all other conditions are the same, the composition of materials forming the second fit layer 150b is to melt at a less powerful beam than the composition of materials forming the first fit layer 150a. For example, the energy of the laser or infrared beam required to start the second frit layer 150b to melt is about 10, 20, 30, 40, 50, 55, 60, 65, 70, 75, 80 or 90% of the energy of the beam required to start the first frit layer 150a to melt when applied for the same period of time. In an embodiment, the first frit layer 150a may be transparent and the second frit layer 150b may be opaque.

The first sealing material 150 is provided between the non-pixel region 100b of the first substrate 100 and the second substrate 200 to attach the first substrate 100 and the second substrate 200 to each other. That is, since the gap between the first substrate 100 and the second substrate 200 is sealed up by the first sealing material 150, the organic light emitting diodes that are interposed between the first substrate and the second substrate 200 are protected from moisture and oxygen. Also, the frit 150 is hardened by irradiating the laser or infrared rays onto the frit 150. At this time, the intensity of the laser radiated onto the frit 150 is in the range of about 25 W to about 60 W.

In an embodiment, when the temperature of heated glass is rapidly reduced, a frit in the form of glass powders is generated. In general, oxide powders are added to the glass powders to be used. When an organic material is added to the frit, a gel-type paste is obtained. At this time, when the gel-type paste is sintered at a predetermined temperature, the organic material is extinguished in the air and the gel-type paste is hardened so that a glass frit is obtained.

The first frit layer 150a is formed to prevent the Newton's ring by way of increasing a gap between the first substrate 100 and the second substrate 200. Newton's rings may be concentric circles and be shown in display surfaces. The Newton's rings may be generated when the distance between the first substrate 100 and the second substrate 200 is small. Therefore, in order to prevent the Newton's ring, there is a need to increase the gap distance between the first substrate 100 and the second substrate 200 by a predetermined height. As an example for this end, there is a way of forming the first sealing material 150 disposed between the first substrate 100 and the second substrate 200 high to increase the gap distance between the first substrate 100 and the second substrate 200. In an embodiment, a width W1 of the first frit layer 150a is from about 0.5 mm to about 1.5 mm. (See FIG. 3.)

The second frit layer 150b includes a filler (not shown) for adjusting a thermal expansion coefficient and an absorbent (not shown) for absorbing laser and infrared rays. By doing so, the second frit layer 150b serves as an absorbing layer of laser or infrared rays. In an embodiment, the laser or the infrared rays are irradiated to bond the first sealing material for sealing the gap between the first substrate 100 and the second substrate 200, and the laser or infrared beam is substantially absorbed by the second frit layer 150b.

In certain embodiments, the first frit layer 150a is a component for increasing the gap distance between the first substrate 100 and the second substrate 200, and the laser or the infrared rays transmit the first frit layer 150a and are projected to the second frit layer 150b. The first frit layer 150b for increasing the gap distance is provided to have a height H1 greater than a height H2 of the second frit layer 150b. (See FIG. 3.) In an embodiment, the first frit layer 150a has a height H1 of 5 μm to 500 μm, and the second frit layer 150b has a height H2 of 3 μm to 100 μm, although not limited to the above.

Figure 4A:
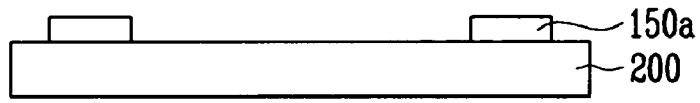
FIGS. 4a to 4e are sectional views illustrating a method of fabricating an organic light emitting display according to an embodiment of the present invention.

FIGS. 4a to 4e are sectional views illustrating a method of fabricating an organic light emitting display according to an embodiment of the present invention. Referring to FIGS. 4a to 4e, in the method of fabricating an organic light emitting display, first the transparent first frit layer 150a is formed on one region of the second substrate 200. The first frit layer 150a, in an embodiment, is made of at least one material selected from the group consisting of $SiO_2$, $B_2O_3$, and $P_2O_5$. Meanwhile, the first frit layer 150a is formed to increase the gap distance between the first substrate 100 and the second substrate 200 and to prevent the Newton's ring from generating (FIG. 4a).

Figure 4B:

After this, the first frit layer 150a is sintered at a predetermined temperature. In an embodiment, the temperature at which the frit layer 150a is sintered is in the range of about 300° C. to about 700° C. After sintering process of the first frit layer 150a, the interfaces of the second substrate 200 and the first frit layer 150a are adhered to each other (FIG. 4b).

Figure 4C:
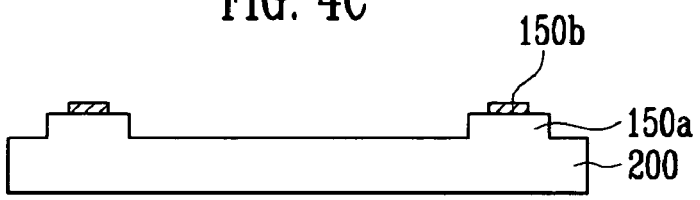

As a following process, an opaque second frit layer 150b is formed on a region of the first frit layer 150a. At this time, the second frit layer 150b includes an absorbent (not shown) for absorbing laser or infrared rays. In an embodiment, the absorbent is one in which at least one material selected from a group consisting of $SiO_2$, $V_2O_5$, and ZnO is added (FIG. 4c).

Figure 4D:
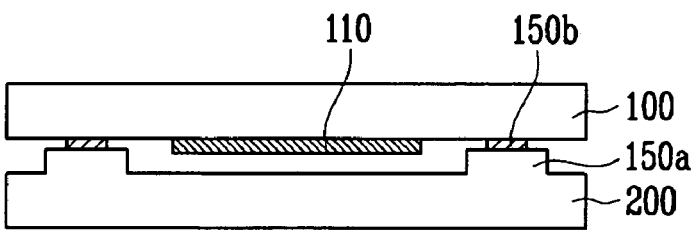

In an embodiment, the temperature at which the frit layer 150a is sintered is in the range of about 300° C. to about 550° C. In other words, the process of sintering the second frit layer 150b may be carried out at a temperature lower than that of sintering the first frit layer 150a. After this, the first substrate 100 is connected to the second substrate 200. At this time, on the first substrate 100, at least an organic light emitting diode (not shown) including a first electrode (not shown), an organic material layer (not shown), and a second electrode (not shown) is formed, and after arranging the first substrate 100 and second substrate 200 such that the organic light emitting diodes (not sown) face the second substrate 200, the first substrate 100 is connected to the second substrate 200 (FIG. 4d).

Figure 4E:
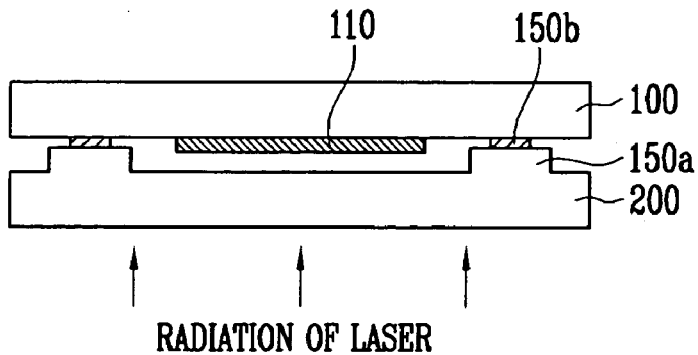

After that, a laser or infrared beam is irradiated to the first frit layer 150a and the second frit layer 150b provided between the second substrate 200 and the first substrate 100 to bond the first frit layer 150a, the second frit layer 150b and the first substrate 100. By doing so, devices disposed between the first substrate 100 and the second substrate 200 including the organic light emitting diode are sealed so that the devices can be protected from moisture or oxygen (FIG. 4e).

In the illustrated embodiment, although the first sealing material 150 formed on the second substrate 200 has been described, the first sealing material 150 may be formed on the first substrate 100 in certain embodiments. In the illustrated embodiment, although, forming the second frit layer 150b on the first frit layer 150a has been described such that a laser or infrared beam transmits the transparent first frit layer 150a and is irradiated to the second frit layer 150b, the positions of the first frit layer 150a and the second frit layer 150b may be exchanged in certain embodiments. Further, in the illustrated embodiment, although the sealing 150 having the first frit layer 150a and the second frit layer 150b has been described, the sealing 150 may have layers more that two layers.

Figure 5A:
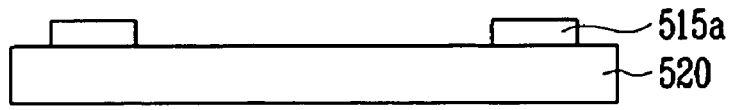
FIGS. 5a to 5g are sectional views illustrating a method of fabricating an organic light emitting display according to an embodiment of the present invention.
Figure 5B:

FIGS. 5a to 5g are sectional views illustrating a method of fabricating an organic light emitting display according to another embodiment of the present invention. Referring to FIGS. 5a to 5g, in the method of fabricating an organic light emitting, first the transparent first frit layer 515a is formed on a region of a second substrate 520 to increase the gap distance between the first substrate 510 and the second substrate 520 to prevent the Newton's ring. At this time, the first frit layer 515 is made of at least one material selected from a group consisting of $SiO_2$, $B_2O_3$, and $P_2O_5$ (FIG. 5a). After this, the first frit layer 515a is sintered at a predetermined temperature. In an embodiment, a temperature at which the first frit layer 515a is sintered is in the range of about 300° C. to about 700° C. Due to the sintering process of the first frit layer 515a, the interfaces of the second substrate 520 and the first frit layer 515a are bonded to each other (FIG. 5b).

Figure 5C:
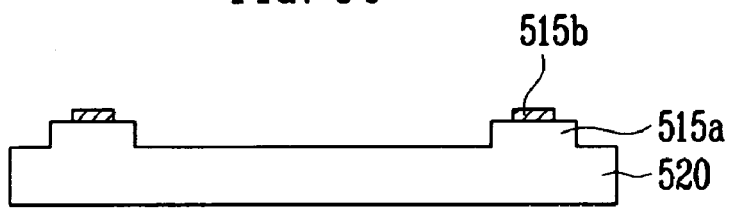
Figure 5D:
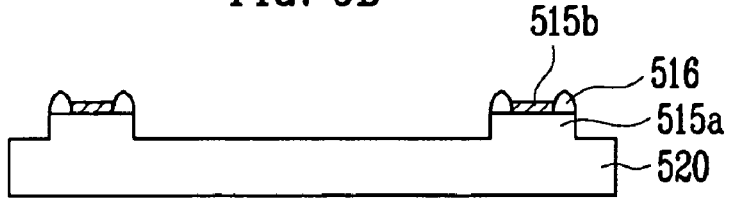

As a following process, an opaque second frit layer 515b is formed on a region of the first frit layer 515a. In an embodiment, the second frit layer 515b is one in which at least one material selected from a group consisting of $SiO_2$, PbO, $V_2O_5$, and ZnO is added. After this, the second flit layer 151b is sintered to bond the interfaces of the first frit layer 515a and the second frit layer 515b to each other (FIG. 5c).

After this, a second sealing material (supplementary sealing structures) 516 as at least one resin selected from a group consisting of epoxy, acrylate, urethane acrylate, and cyanoacrylate is formed on the first frit layer 515a. At this time, the second sealing material 516, as illustrated in the drawings, may be formed on the first frit layer 515a to run parallel on both sides of the second frit layer 515b along the second frit layer 515b, may be formed to run parallel along the second frit layer 515b inside the second frit layer 515b on the first frit layer 515a, or may be formed to run parallel along the second fit layer 515b outside the second frit layer 515b on the first frit layer 515a. As such, the second sealing material 515 is provided at least one of the left and right sides of the second frit layer 515b such that resistance against impact or shock is increased and adhesive force between the first substrate and the second substrate is increased.

Figure 5E:
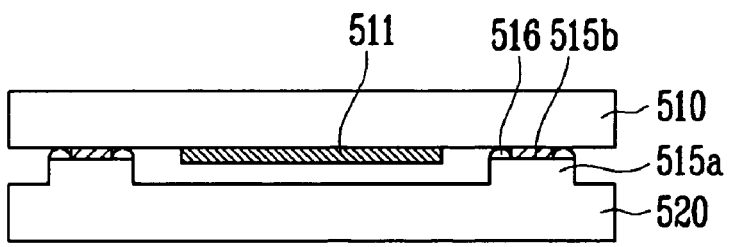

After this, the first substrate 510 is connected to the second substrate 520. At this time, on the first substrate 510, at least an organic light emitting diode (not shown) including a first electrode (not shown), an organic material layer (not shown), and a second electrode (not shown) is formed, and after arranging the first substrate 510 and the second substrate 520 such that the organic light emitting diode (not sown) is disposed between the first substrate 510 and the second substrate 520, the first substrate 510 is connected to the second substrate 520 (FIG. 5e).

Figure 5F:
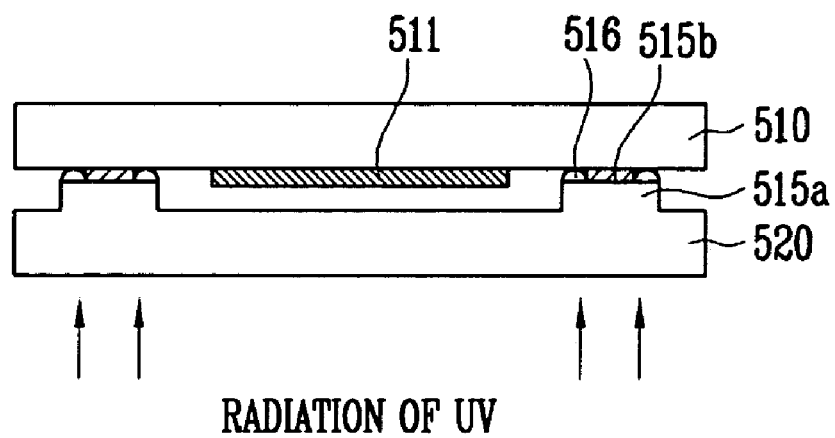
Figure 5G:
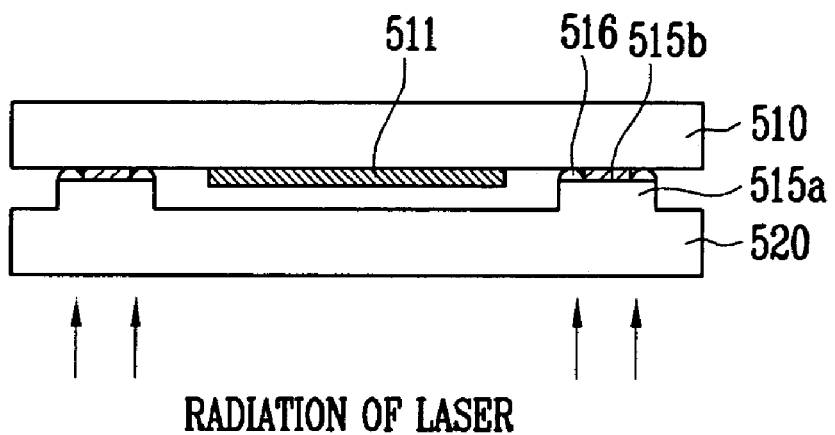

As a following process, ultraviolet rays are irradiated to the second sealing material 516 to cure the second sealing material 516 (FIG. 5f). After this, a laser or infrared beam is irradiated to the first frit layer 515a and the second frit layer 515b provided between the second substrate 520 and the first substrate 510 to bond the first frit layer 515a, the second frit layer 515b and the first substrate 510. By doing so, devices disposed between the first substrate 510 and the second substrate 520 including the organic light emitting diode are sealed so that the devices can be protected from moisture or oxygen (FIG. 5g).

In the organic light emitting display device and the method of fabricating the same according to embodiments of the present invention, the Newton's ring can be prevented by adjusting the distance between a first substrate and the second substrate. Moreover, an epoxy-based second sealing material is provided as an auxiliary sealing material to reinforce the device for shock-resistance and to effectively seal the organic light emitting diode.

Although a few embodiments of the present invention have been shown and described, it would be appreciated by those skilled in the art that changes might be made in this embodiment without departing from the principles and spirit of the invention, the scope of which is defined in the claims and their equivalents.

What is claimed is:

1. An organic light emitting display device, comprising:
   a flat first substrate having a plate-like shape;
   a flat second substrate having a plate-like shape and opposing the first substrate;
   an array of organic light emitting pixels interposed between the first and second substrates; and
   a stack of layers of glass frit portions, which forms a closed loop surrounding the array and interposed between the first and second substrates, wherein the stack of layers of glass frit portions comprises a first glass frit portion and a second glass frit portion, wherein the first glass frit portion is interposed between the first substrate and the second glass frit portion, and the second glass frit portion is interposed between the first glass frit portion and the second substrate, wherein the second glass frit portion comprises a material that melts substantially easier than the first glass frit portion upon irradiation of a laser or infrared beam thereto, and wherein the first glass frit portion and a surface of the first substrate contacting the first glass frit portion have different compositions,
   wherein the first glass frit portion comprises a material and the second glass frit portion comprises the same material,
   wherein each of the first and second glass frit portions comprises a light-to-heat conversion material configured to generate heat upon receiving the laser or infrared beam, and wherein the second glass frit portion comprises an amount of the light-to-heat conversion material substantially more than the first glass frit portion.

2. The device of claim 1, wherein the second glass frit portion comprises a light-to-heat conversion material configured to generate heat upon receiving the laser or infrared beam, and wherein the first glass frit portion is substantially free of the light-to-heat conversion material.

3. The device of claim 1, wherein the first glass frit portion is substantially transparent.

4. The device of claim 1, wherein the second glass frit portion is substantially non-transparent.

5. The device of claim 1, wherein one of the first and second glass frit portions comprises at least one selected from the group consisting of $SiO_2$, PbO, $V_2O_5$, ZnO, $B_2O_3$, and $P_2O_5$.

6. The device of claim 1, wherein the first glass frit portion comprises a first end facing the second substrate, the second glass frit portion comprises a second end facing the first substrate, wherein the first end has a first width perpendicular to the shortest imaginary line interconnecting the first and second substrates in a plane perpendicular to an elongation of the first segment, and wherein the second end has a second width in the same direction, wherein the first width is greater than the second width.

7. The device of claim 6, wherein the second end contacts a peripheral portion of the first end along the direction.

8. The device of claim 6, wherein the second end contacts a central portion of the first end along the direction.

9. The device of claim 1, wherein the first glass frit portion comprises a first end facing the second substrate, the second glass frit portion comprises a second end facing the first substrate, wherein the first portion has a first height from the first substrate to the first end in a direction parallel to the shortest imaginary line interconnecting the first and second substrates in a plane perpendicular to an elongation of the first segment, wherein the second portion has a second height from the second substrate to the second end in the same direction, wherein the first height is greater than the second height.

10. The device of claim 1, wherein the array is formed on the second substrate, and wherein the array and the first substrate form a gap therebetween.

11. The device of claim 1, wherein the device is configured to display image through the first substrate.

12. The device of claim 1, wherein the first glass frit portion has a volume substantially greater than that of the second glass fit portion.

13. The device of claim 1, wherein the first glass frit portion is bonded to the first substrate by baking the first substrate and the first glass fit portion in contact with the first substrate.

14. The device of claim 1, wherein the second glass frit portion is bonded to the second substrate and the first glass frit portion by applying a laser or infrared light thereto.

15. The device of claim 1, further comprising at least one supplementary sealing structure extending along the first segment, wherein the at least one supplementary sealing structure is interposed between and interconnects the first and second substrates, wherein the supplementary sealing structure is located inside or outside the enclosed space.

16. The device of claim 15, wherein the supplementary sealing structure is configured to improve sealing of the enclosed space.

17. The device of claim 1, further comprising a first supplementary sealing structure and a second supplementary sealing structure, each of which is interposed between and interconnects the first and second substrates, wherein the first supplementary sealing structure extends along the first segment inside the enclosed space, and wherein the second supplementary sealing structure extends along the first segment outside the enclosed space.

18. The device of claim 1, further comprising a supplementary sealing structure extending along the first segment and located inside or outside the enclosed space, wherein the supplementary sealing structure comprises a portion interposed between and interconnects the first glass frit portion and the second substrate.

19. The device of claim 18, wherein the supplementary sealing structure comprises another portion that is not interposed between the first glass frit portion of the glass frit seal and the first substrates.

20. The device of claim 1, further comprising a first supplementary sealing structure and a second supplementary sealing structure, each of which extends along the first segment inside or outside the enclosed space, wherein the first supplementary sealing structure is interposed between and interconnects the first and second substrates, wherein the second supplementary sealing structure is interposed between and interconnects the first glass frit portion and the second substrate.

21. The device of claim 1, wherein the glass frit seal comprises one or more materials selected from the group consisting of magnesium oxide (MgO), calcium oxide (CaO), barium oxide (BaO), lithium oxide ($Li_2O$), sodium oxide ($Na_2O$), potassium oxide ($K_2O$), boron oxide ($B_2O_3$), vanadium oxide ($V_2O_5$), zinc oxide (ZnO), tellurium oxide ($TeO_2$), aluminum oxide ($Al_2O_3$), silicon dioxide ($SiO_2$), lead oxide (PbO), tin oxide (SnO), phosphorous oxide ($P_2O_5$), ruthenium oxide ($Ru_2O$), rubidium oxide ($Rb_2O$), rhodium oxide ($Rh_2O$), ferrite oxide ($Fe_2O_3$), copper oxide (CuO), titanium oxide ($TiO_2$), tungsten oxide ($WO_3$), bismuth oxide ($Bi_2O_3$), antimony oxide ($Sb_2O_3$), lead-borate glass, tin-phosphate glass, vanadate glass, and borosilicate.

* * * * *

UNITED STATES PATENT AND TRADEMARK OFFICE
CERTIFICATE OF CORRECTION

| | | |
|---|---|---|
| PATENT NO. | : 8,125,146 B2 | Page 1 of 1 |
| APPLICATION NO. | : 11/541009 | |
| DATED | : February 28, 2012 | |
| INVENTOR(S) | : Jin Woo Park | |

It is certified that error appears in the above-identified patent and that said Letters Patent is hereby corrected as shown below:

Title Page 1 (Item 54) Title, Line 4, and in Column 1, Line 4, title, Change "A" to --A FIRST--. (Second Occurrence)

In Column 1, Line 38 (Approx.), Change "STURUTURE" to --STRUCTURE--.

In Column 1, Line 42 (Approx.), Change "STURUTURE" to --STRUCTURE--.

In Column 2, Line 33, Change "fit" to --frit--.

In Column 2, Line 42, Change "fit" to --frit--.

In Column 2, Line 43, Change "fit" to --frit--.

In Column 10, Line 42, Change "flit" to --frit--.

In Column 12, Line 42, Change "fit" to --frit--.

In Column 12, Line 47, Change "fit" to --frit--.

In Column 12, Line 48, Change "fit" to --frit--.

In Column 14, Line 36, Change "that" to --than--.

In Column 14, Line 57, Change "flit" to --frit--.

In Column 15, Line 3, Change "fit" to --frit--.

In Column 16, Line 52, In Claim 12, change "fit" to --frit--.

In Column 16, Line 55, In Claim 13, change "fit" to --frit--.

Signed and Sealed this
Twenty-fifth Day of September, 2012

David J. Kappos
*Director of the United States Patent and Trademark Office*